United States Patent
Yen

(10) Patent No.: US 6,582,757 B1
(45) Date of Patent: Jun. 24, 2003

(54) METHOD FOR TUNGSTEN DEPOSITION WITHOUT FLUORINE-CONTAMINATED SILICON SUBSTRATE

(75) Inventor: Chun-Yao Yen, Taipei (TW)

(73) Assignee: ProMos Technologies, Inc., Hsin-chu (TW)

( * ) Notice: Subject to any disclaimer, the term of this patent is extended or adjusted under 35 U.S.C. 154(b) by 211 days.

(21) Appl. No.: 09/686,774

(22) Filed: Oct. 12, 2000

(51) Int. Cl.[7] .............................. B05D 5/12; H07L 21/44
(52) U.S. Cl. ...................... 427/97; 427/99; 427/255.18; 427/255.392; 438/645; 438/655; 438/656; 438/672; 438/675; 438/683; 438/685
(58) Field of Search .................. 427/97, 99, 255.15, 427/255.18, 255.28, 255.392, 314; 438/642, 645, 653, 655, 656, 672, 675, 677, 683, 685

(56) References Cited

U.S. PATENT DOCUMENTS

| | | | |
|---|---|---|---|
| 5,231,056 A | * | 7/1993 | Sandhu ........................ 437/200 |
| 5,604,158 A | * | 2/1997 | Cadien et al. ............... 437/200 |
| 5,981,352 A | | 11/1999 | Zhao et al. .................. 438/401 |
| RE36,663 E | | 4/2000 | Smith et al. ................. 438/622 |
| 6,066,366 A | | 5/2000 | Berenbaum et al. ........ 427/250 |
| 6,096,651 A | | 8/2000 | Wang et al. ................. 438/691 |
| 6,099,904 A | | 8/2000 | Mak et al. ................... 427/253 |
| 6,284,650 B1 | * | 9/2001 | Czarnik et al. ............. 438/649 |

* cited by examiner

Primary Examiner—Brian K. Talbot
(74) Attorney, Agent, or Firm—George O. Saile; Stephen B. Ackerman

(57) ABSTRACT

A method for forming tungsten structures over silicon substrates, including the following steps. A silicon substrate is having a patterned dielectric layer formed thereon defining a tungsten structure opening is provided. The silicon substrate is pre-heated to a temperature of from about 430 to 440° C. A Si-rich $WS_x$ layer is formed over the patterned dielectric layer, lining the tungsten structure opening. A $WSi_x$ nucleation layer is formed over the Si-rich $WSi_x$ layer. A tungsten bulk layer is formed over the $WSi_x$ nucleation layer, filling the tungsten structure opening, whereby fluorine attack of the Si substrate is minimized.

23 Claims, 4 Drawing Sheets

| Step Name | Position Wafer | Gas_On | By-Pass | Heat | Chuck | Check | Preset | NUC1 | NUC2 | Bulk W |
|---|---|---|---|---|---|---|---|---|---|---|
| Chamber Select | ABCD | ABCD | ABCD | ABCD | ABCD | ABCD | ABCD | ABCD | ABCD | |
| Step Control | By-Time | By-Time | By-Time | By-Time | By-Time | By-Time | By-Time | By-Time | By-Time | |
| Maximum Step Time | 5 | 1 | 5 | 30 | 4 | 1 | 5 | 5 | 20 | 60±15 |
| End-point Select | No-Endpoint | No-Endpoint | No-Endpoint | No-Endpoint | No-Endpoint | No-Endpoint | No-Endpoint | No-Endpoint | No-Endpoint | |
| Pressure (Torr) | Throttle-open | Throttle-open | Servo30T | Servo30T | Servo30T | Servo30T | Servo30T | Servo30T | Servo30T | 90±9 |
| RF Power & match | 0 Auto | 0 Auto | 0 Auto | 0 Auto | 0 Auto | 0 Auto | 0 Auto | 0 Auto | 0 Auto | |
| Heat Temp | 425C* | 425C* | 425C* | 425C* | 425C* | 425C* | 425C* | 425C | 425C | 425C |
| Temp Ramp | 0 | 0 | 0 | 0 | 0 | 0 | 0 | 0 | 0 | |
| Heater Spacing | 400 | 400 | 400 | 400 | 400 | 400 | 400 | 400 | 400 | |
| Gas name & Flow (sccm) | | | | | | | | | | |
| H2 (edge) | | | | | | | | | | |
| Ar | | 1000 | 1000 | 1000 | 1000 | 1000 | 2000 | 2000 | 2000 | 300±100 |
| N2 | | 300 | 300 | 300 | 300 | 300 | 300 | 300 | 300 | |
| WF6(L) | | | | | | | | | | 120±12 |
| WF6(H) | | | | | | | | 5 | 5 | |
| SiH4 | | | | 30 | | | | 20 | 20 | |
| H2 | | | | | 500 | 500 | 500 | 500 | 500 | 1000±300 |
| Ar(edge) | | | | | | | 800 | 800 | 800 | |
| NF3 | | | | | | | | | | |
| Bottom Purge | OFF | ON | ON | ON | ON | ON | ON | ON | ON | |
| Temp Preset | 0 | 0 | 0 | 0 | 0 | 0 | 0 | 0 | 0 | |
| Bottom Check | By-Pass | By-Pass | By-Pass | By-Pass | Full/0 | Full/3 | Preset/3 | Preset/3 | Preset/5 | |
| Micro Wave generator Power | 0 | 0 | 0 | 0 | 0 | 0 | 0 | 0 | 0 | |
| Micro Wave Ctrl Mode | off | off | off | off | off | off | off | off | off | |

FIG. 7

METHOD FOR TUNGSTEN DEPOSITION WITHOUT FLUORINE-CONTAMINATED SILICON SUBSTRATE

FIELD OF THE INVENTION

The present invention relates generally to methods of forming metal structures in semiconductor devices and specifically to methods of depositing tungsten metal structures on silicon semiconductor structures.

BACKGROUND OF THE INVENTION

Deposition of tungsten (W) involves the use of a $WF_6$ compound as the source of tungsten. Fluorine (F) attack of the silicon (Si) substrate presents a continuing problem.

U.S. Pat. No. 6,099,904 to Mak et al. describes a tungsten process with a nucleation step.

U.S. Pat. No. 6,096,651 to Wang et al., U.S. Pat. No. 6,066,366 to Berenbaum et al., U.S. Pat. No. Re 36,663 to Smith et al., and U.S. Pat. No. 5,981,352 to Zhao et al. each describe various tungsten deposition processes.

SUMMARY OF THE INVENTION

Accordingly, it is an object of the present invention to provide a method to fabricate metal structures that minimizes fluorine attack.

Another object of the present invention is to provide a method to fabricate tungsten metal structures over silicon semiconductor structures that minimizes fluorine attack.

Other Objects will appear Hereinafter.

It has now been discovered that the above and other objects of the present invention may be accomplished in the following manner. Specifically, a silicon substrate is having a patterned dielectric layer formed thereon defining a tungsten structure opening is provided. The silicon substrate is pre-heated to a temperature of from about 430 to 440° C. A Si-rich $WSi_x$ layer is formed over the patterned dielectric layer, lining the tungsten structure opening. A $WSi_x$ nucleation layer is formed over the Si-rich $WSi_x$ layer. A tungsten bulk layer is formed over the $WSi_x$ nucleation layer, filling the tungsten structure opening, whereby fluorine attack of the Si substrate is minimized.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which:

FIG. 7 is a table indicating select parameters for the indicated steps of the previous process known to the inventor.

DETAILED DESCRIPTION OF THE PREFERRED EMBODIMENT

Unless otherwise specified, all structures, layers, etc. may be formed or accomplished by conventional methods known in the prior art.

Process Known to the Inventor

The following previous process is known to the inventor and is not to be considered prior art.

To minimize fluorine (F) attack upon the silicon substrate, a deposited tungsten (W) film comprises three different films: a lower Si-rich $WSi_x$ adhesion film upon the Si substrate; an intermediate $WSi_x$ nucleation film, and an overlying W bulk film as the main layer. The Si-rich $WSi_x$ adhesion film is a nucleation film/layer which can reduce the fluorine attack of the Si substrate. These steps occur at a temperature of about 425° C. and at the parameters indicated for the various steps as shown in FIG. 7. Please note that the steps with their respective "Heat Temps" marked with an asterisk may be run in a separate chamber at a higher temperature of from about 5 to 15° C. to avoid sacrificing the throughput.

SUMMARY OF THE INVENTION

The key point of the present invention is to add a wafer pre-heat step to the previous process known to the inventor to improve the ability to prevent the fluorine attack of the silicon substrate. That is, the silicon wafer is pre-heated an additional 5 to 15° C. before deposition of the lowermost Si-rich WSix layer which will enrich the Si content in the nucleation layer.

Preferred Embodiment of the Present Invention

Figure 1:
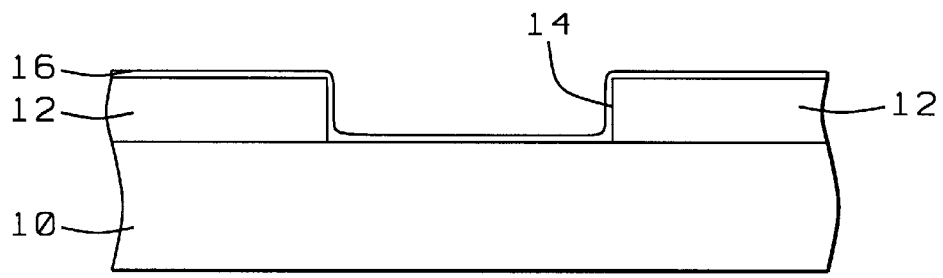
FIGS. 1 through 5 schematically illustrate in cross-sectional representation a preferred embodiment of the present invention.

Accordingly as shown in FIG. 1, patterned TEOS layer 12 is formed over silicon wafer 10 defining plug opening 14.

TiN barrier layer 16 may then be formed over patterned TESO layer 12 and lining plug opening 14. TiN barrier layer 16 is preferably from about 125 to 400 Å thick, and is more preferably from about 150 to 375 Å.

Key Step of the Invention

Figure 2:
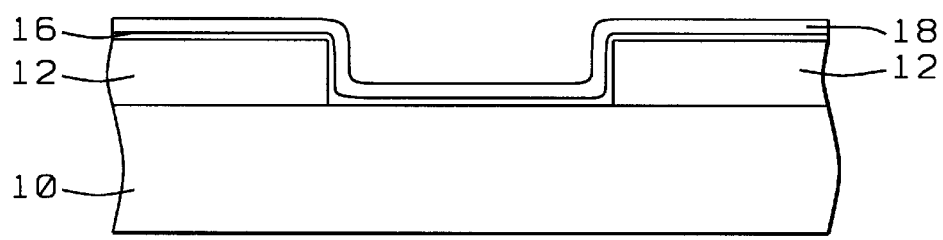

In the key step of the invention, as shown in FIG. 2, Si wafer 10 is pre-heated from about 5 to 15° C. over the 425° C. temperature of the previous process known to the inventor before formation of the composite tungsten plug 50. That is the Si wafer 10 is pre-heated to preferably from about 430 to 440° C., and more preferably to about 440° C. This will enrich the Si content in the $WSi_x$ nucleation film/layer 20.

Formation of Si-Rich $WSi_x$ Layer 18

As shown in FIG. 2, Si-rich $WSi_x$ film/layer 18 is formed over optional TiN barrier layer 16 (over the pre-heated Si wafer 10) at substantially the parameters shown for the "NUC1" step shown in the table of FIG. 7.

Si-rich $WSi_x$ layer 18 is formed to a thickness of preferably from about 8 to 12 Å, and more preferably about 10 Å and has a Si concentration of preferably from about $1.5 \times 10^5$ to $3.5 \times 10^5$ Si atoms/cm$^3$.

Formation of $WSi_x$ Nucleation Film 20

Figure 3:
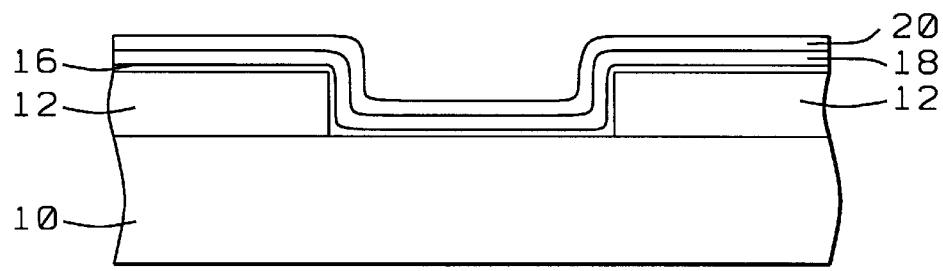

As shown in FIG. 3, $WSi_x$ nucleation film/layer 20 is formed over Si-rich $WSi_x$ film/layer 18 at substantially the parameters shown for the "NUC2" step shown in the table of FIG. 7.

$WSi_x$ nucleation film/layer 20 is formed to a thickness of preferably from about 550 to 650 Å, and more preferably from about 500 to 600 Å.

Formation of W Plug 24

Figure 4:
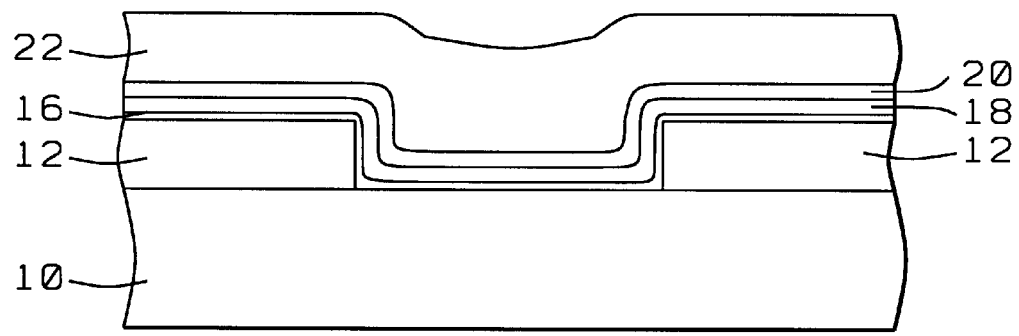

As shown in FIG. 4, tungsten (W) bulk layer 22 is formed over $WSi_x$ nucleation film/layer 20, filling $WSi_x$ nucleation film/layer 20 lined plug opening 14, at substantially the parameters shown for the "BULK W" step shown in the table of FIG. 7.

W layer 22 is formed to a thickness sufficient to completely fill nucleation film/layer 20 lined plug opening 14.

Figure 5:
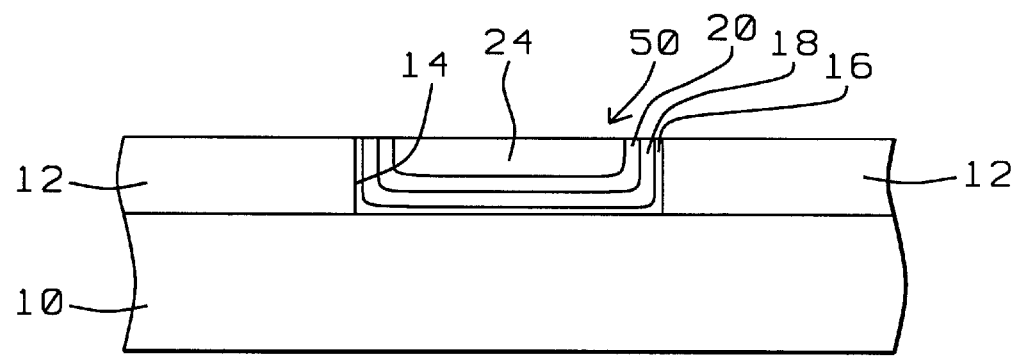

As shown in FIG. 5, W layer 22 is planarized, preferably by chemical mechanical polishing (CMP), to remove the excess of W layer 22, WSi$_x$ nucleation film/layer 20, Si-rich WSi$_x$ film/layer 18, and TiN barrier layer 18 over patterned TEOS layer 16 to form planarized W plug 24 within plug opening 14.

W plug 24 has a thickness of preferably from about 2500 to 6500 Å, and more preferably from about 3000 to 6000 Å.

Composite W plug 50 includes lowermost Si-rich WSi$_x$ film/layer 18, intermediate WSi$_x$ nucleation film/layer 20, and uppermost W plug 24.

Optimal Si Wafer Pre-Heat Temperature

Figure 6:
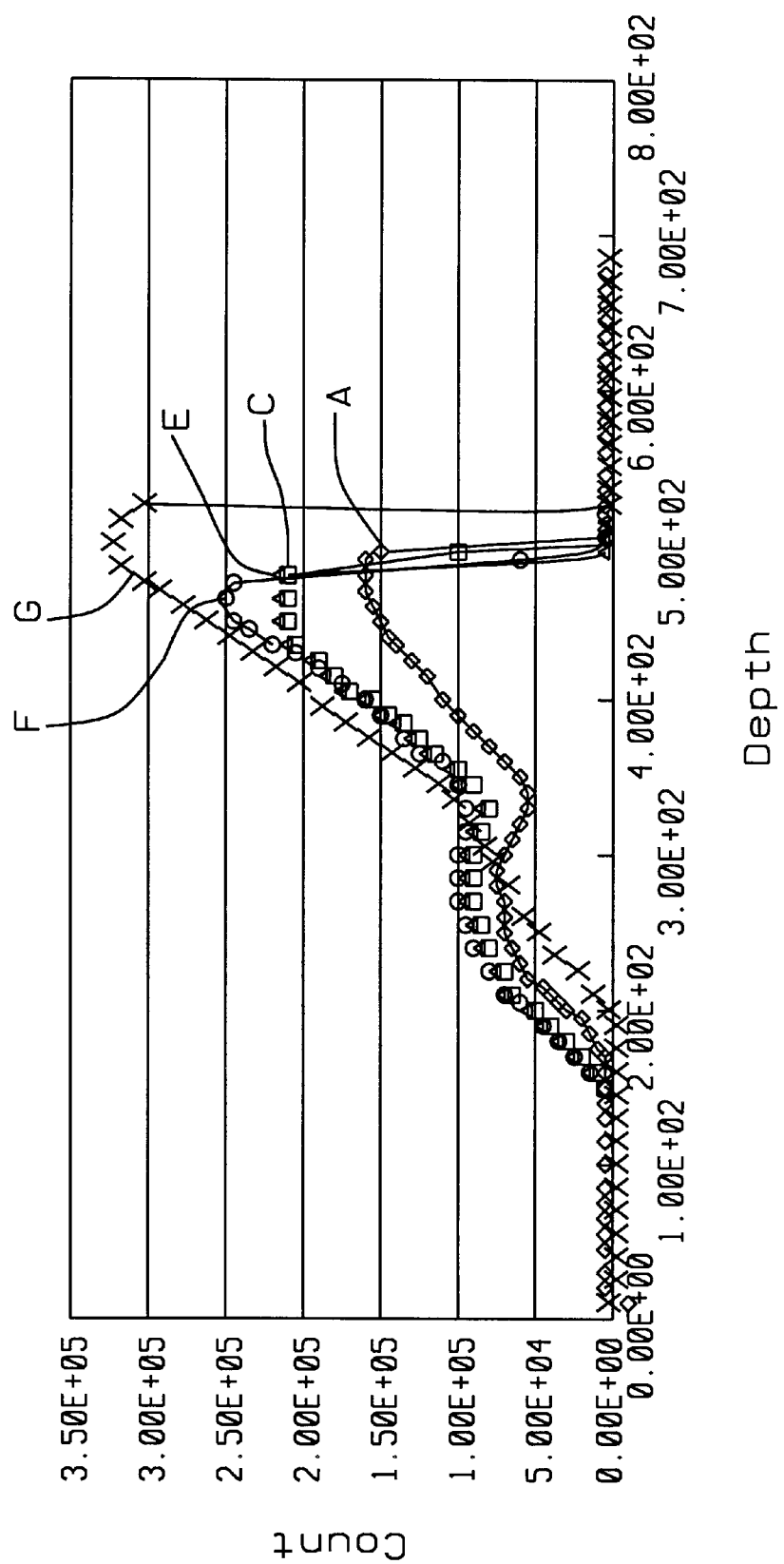
FIG. 6 is a graph of measurement depth versus SIMS value for various increasing temperatures A through G with the higher temperature G having formed a higher Si ratio, i.e. Si-rich.

The graph shown in FIG. 6 plots measurement depth (x-axis) versus SIMS value (count, y-axis) for various temperatures marked as A (415° C.), C (425° C.), E (430° C.), F (435° C.), and G (440° C.).

As shown in FIG. 6, the higher the temperature, the higher the Si ratio, i.e. Si-rich. Therefore the optimum pre-heat temperature is about 440° C. to achieve a maximum Si-rich WSi$_x$ film/layer 18. The increased Si concentration in Si-rich WSi$_x$ film/layer 18 and in WSi$_x$ nucleation film/layer 20 minimizes/eliminates F attack of Si wafer 10. This is because the F attacks the additional Si in Si-rich WSi$_x$ film/layer 18 and in WSi$_x$ nucleation film/layer 20 and the F, in effect, spent before it can attack Si wafer 10.

Advantages of the Present Invention

The advantages of the present invention includes fluorine attack of the silicon substrate/wafer is minimized/eliminated.

While particular embodiments of the present invention have been illustrated and described, it is not intended to limit the invention, except as defined by the following claims.

I claim:

1. A method for forming tungsten structures over silicon substrates, including the steps of:
   providing a silicon substrate having a patterned dielectric layer formed thereon defining a tungsten structure opening;
   pre-heating the silicon substrate to a first temperature;
   forming a Si-rich WSi$_x$ layer over the patterned dielectric layer at a second temperature, lining the tungsten structure opening; wherein the first temperature is from about 5 to 15° C. higher than the second temperature;
   forming a WSi$_x$ nucleation layer over the Si-rich WSi$_x$ layer; and
   forming a tungsten bulk layer over the WSi$_x$ nucleation layer, filling the tungsten structure opening;
   whereby fluorine attack of the Si substrate is minimized.

2. The method of claim 1, further including the step of planarizing the structure to remove the excess of the tungsten layer, WSi$_x$ the nucleation layer, and the Si-rich WSi$_x$ film/layer from the patterned dielectric layer to form a planarized composite tungsten plug.

3. The method of claim 1, further including the step of forming a barrier layer over the patterned dielectric layer, lining the tungsten structure opening, whereby the Si-rich WSi$_x$ layer is formed over the barrier layer.

4. The method of claim 1, wherein the patterned dielectric layer is comprised of TEOS.

5. The method of claim 1, further including the step of forming a TiN barrier layer over the patterned dielectric layer, lining the tungsten structure opening, whereby the Si-rich WSi$_x$ layer is formed over the TiN barrier layer.

6. The method of claim 1, wherein the Si-rich WSi$_x$ layer has a Si concentration of from about $1.5 \times 10^5$ to $3.5 \times 10^5$ Si atoms/cm$^3$.

7. The method of claim 1, wherein the Si-rich WSi$_x$ layer is from about 8 to 12 Å thick; and the WSi$_x$ nucleation layer is from about 550 to 650 Å thick.

8. The method of claim 1, wherein the Si-rich WSi$_x$ layer is about 10 Å thick; and the WSi$_x$ nucleation layer is from about 500 to 600 Å thick.

9. A method for forming tungsten structures over silicon substrates, including the steps of:
   providing a silicon substrate having a patterned dielectric layer formed thereon defining a tungsten structure opening;
   pre-heating the silicon substrate to a preheating temperature of from about 430 to 440° C.;
   forming a Si-rich WSi$_x$ layer over the patterned dielectric layer, lining the tungsten structure opening; wherein the formation of the Si-rich WSi$_x$ layer is achieved at a temperature that is from about 5 to 15° C. lower than the pre-heating temperature;
   forming a WSi$_x$ nucleation layer over the Si-rich WSi$_x$ layer;
   forming a tungsten bulk layer over the WSi$_x$ nucleation layer, filling the tungsten structure opening; and
   planarizing the structure to remove the excess of the tungsten layer, WSi$_x$ the nucleation layer, and the Si-rich WSi$_x$ film/layer from the patterned dielectric layer to form a planarized composite tungsten plug;
   whereby fluorine attack of the Si substrate is minimized.

10. The method of claim 9, further including the step of forming a barrier layer over the patterned dielectric layer, lining the tungsten structure opening, whereby the Si-rich WSi$_x$ layer is formed over the barrier layer.

11. The method of claim 9, wherein the patterned dielectric layer is comprised of TEOS.

12. The method of claim 9, further including the step of forming a TiN barrier layer over the patterned dielectric layer, lining the tungsten structure opening, whereby the Si-rich WSi$_x$ layer is formed over the TiN barrier layer.

13. The method of claim 9, wherein the Si-rich WSi$_x$ layer has a Si concentration of from about $1.5 \times 10^5$ to $3.5 \times 10^5$ Si atoms/cm$^3$.

14. The method of claim 9, wherein the Si-rich WSi$_x$ layer is from about 8 to 12 Å thick; the WSi$_x$ nucleation layer is from about 550 to 650 Å thick; and the planarized tungsten layer is from about 2500 to 6500 Å thick.

15. A method for forming tungsten structures over silicon substrates, including the steps of:
   providing a silicon substrate having a patterned dielectric layer formed thereon defining a tungsten structure opening;
   forming a barrier layer over the patterned dielectric layer, lining the tungsten structure opening;
   pre-heating the silicon substrate to a pre-heating temperature of from about 430 to 440° C.;
   forming a Si-rich WSi$_x$ layer over the barrier layer; wherein the formation of the Si-rich WSi$_x$ layer is achieved at a temperature that is from about 5 to 15° C. lower than the pre-heating temperature;
   forming a WSi$_x$ nucleation layer over the Si-rich WSi$_x$ layer;
   forming a tungsten bulk layer over the WSi$_x$ nucleation layer, filling the tungsten structure opening; and
   planarizing the structure to remove the excess of the tungsten layer, WSi$_x$ the nucleation layer, and the Si-rich WSi$_x$ film/layer from the patterned dielectric layer to form a planarized composite tungsten plug;
   whereby fluorine attack of the Si substrate is minimized.

16. The method of claim 15, wherein the patterned dielectric layer is comprised of TEOS.

17. The method of claim 15, wherein the barrier layer is comprised of TiN.

18. The method of claim 15, wherein the Si-rich $WSi_x$ layer has a Si concentration of from about $1.5 \times 10^5$ to $3.5 \times 10^5$ Si atoms/cm$^3$.

19. The method of claim 15, wherein the barrier layer is from about 125 to 400 Å thick; the Si-rich $WSi_x$ layer is from about 8 to 12 Å thick; the $WSi_x$ nucleation layer is from about 550 to 650 Å thick; and the planarized tungsten layer is from about 2500 to 6500 Å thick.

20. The method of claim 1, wherein the silicon substrate is pre-heated to a first temperature of from about 430 to 440° C.

21. The method of claim 1, wherein the silicon substrate is pre-heated to a first temperature of about 440° C.

22. The method of claim 9, wherein the silicon substrate is pre-heated to a pre-heating temperature of about 440° C.

23. The method of claim 15, wherein the silicon substrate is pre-heated to a pre-heating temperature of about 440° C.

* * * * *